US012772423B2

(12) United States Patent

Takahashi et al.

(10) Patent No.: US 12,772,423 B2
(45) Date of Patent: Oct. 20, 2026

(54) VEHICLE DRIVE DEVICE

(71) Applicants: MITSUBISHI JIDOSHA KOGYO KABUSHIKI KAISHA, Tokyo (JP); MEIDENSHA CORPORATION, Tokyo (JP)

(72) Inventors: Tsuyoshi Takahashi, Tokyo (JP); Kiminobu Terao, Tokyo (JP); Yosuke Morimoto, Okazaki (JP); Takuya Ogasawara, Okazaki (JP); Hiromichi Akiyama, Tokyo (JP); Dai Oono, Tokyo (JP)

(73) Assignees: MITSUBISHI JIDOSHA KOGYO KABUSHIKI KAISHA, Tokyo (JP); MEIDENSHA CORPORATION, Tokyo (JP)

( * ) Notice: Subject to any disclaimer, the term of this patent is extended or adjusted under 35 U.S.C. 154(b) by 242 days.

(21) Appl. No.: 18/693,353

(22) PCT Filed: Sep. 28, 2022

(86) PCT No.: PCT/JP2022/036090

§ 371 (c)(1),
(2) Date: Mar. 19, 2024

(87) PCT Pub. No.: WO2023/054438

PCT Pub. Date: Apr. 6, 2023

(65) Prior Publication Data

US 2024/0397679 A1 Nov. 28, 2024

(30) Foreign Application Priority Data

Oct. 1, 2021 (JP) ................................. 2021-162478

(51) Int. Cl.
*H05K 7/20* (2006.01)
*B60K 1/02* (2006.01)
(Continued)

(52) U.S. Cl.
CPC ........... *H05K 7/20927* (2013.01); *B60K 1/02* (2013.01); *B60L 15/007* (2013.01); *F16H 57/02* (2013.01);
(Continued)

(58) Field of Classification Search
CPC ...... H05K 7/20927; H02K 7/116; B60K 1/02; B60L 15/007; F16H 57/02;
(Continued)

(56) References Cited

U.S. PATENT DOCUMENTS

2015/0305188 A1* 10/2015 Maeda ..................... H05K 7/02 361/728
2023/0238911 A1* 7/2023 Kobayashi .............. H02P 29/68 318/471
2023/0328911 A1* 10/2023 Helwich ................ B60L 50/51 361/752

FOREIGN PATENT DOCUMENTS

JP 2017-184523 A 10/2017
JP 2021029059 A * 2/2021
JP 2022-149925 A 10/2022

OTHER PUBLICATIONS

Japanese Office Action for Japanese Application No. 2023-551577, dated Jan. 7, 2025, with English translation.
(Continued)

*Primary Examiner* — Edwin A Young
(74) *Attorney, Agent, or Firm* — Birch, Stewart, Kolasch & Birch, LLP

(57) ABSTRACT

A vehicle drive device (10) includes: a motor unit (1) that includes a motor for driving mounted on a vehicle and a gear mechanism that transmits torque of the motor to each of left and right wheels of the vehicle; and an inverter (4) that is arranged over the motor unit (1) and that includes a capacitor (5) smoothing electricity and a semiconductor module (6) including a plurality of switching elements, wherein the
(Continued)

inverter (4) includes a tray unit (16) that accommodates the capacitor (5) and the semiconductor module (6), and a cover (15) that is in a flat-plate shape, is attached to the tray unit (16), and covers the capacitor (5) and the semiconductor module (6) from above the capacitor (5) and the semiconductor module (6), the cover (15) is integrated with a cooling unit (20) through which a coolant for cooling the inverter (4) flows, and the capacitor (5) and the semiconductor module (6) are attached to a lower surface (17) of the cover (15).

6 Claims, 5 Drawing Sheets

(51) Int. Cl.
*B60L 15/00* (2006.01)
*F16H 57/02* (2012.01)
*H02K 7/116* (2006.01)

(52) U.S. Cl.
CPC .... *H02K 7/116* (2013.01); *F16H 2057/02026* (2013.01); *F16H 2057/02034* (2013.01); *F16H 2057/02052* (2013.01)

(58) Field of Classification Search
CPC . F16H 2057/02026; F16H 2057/02034; F16H 2057/02052
See application file for complete search history.

(56) References Cited

OTHER PUBLICATIONS

English translation of the International Preliminary Report on Patentability and Written Opinion of the International Searching Authority for International Application No. PCT/JP2022/036090, dated April 2. 2024.
International Search Report for PCT/JP2022/036090 (PCT/ISA/210) mailed on Nov. 29, 2022.
Written Opinion of the International Searching Authority for PCT/JP2022/036090 (PCT/ISA/237) mailed on Nov. 29, 2022.
English translation of the International Preliminary Report on Patentability and Written Opinion of the International Searching Authority for International Application No. PCT/JP2022/036089, dated Apr. 2, 2024.
English translation of the International Search Report for PCT/JP2022/036089 (PCT/ISA/210) mailed on Nov. 29, 2022.
U.S. Office Action for U.S. Appl. No. 18/693,390, dated Feb. 23, 2026.
Written Opinion of the International Searching Authority for PCT/JP2022/036089 (PCT/ISA/237) mailed on Nov. 29, 2022.

* cited by examiner

VEHICLE DRIVE DEVICE

TECHNICAL FIELD

The present disclosure relates to a vehicle drive device that drives left and right wheels of a vehicle using electricity of a battery.

BACKGROUND TECHNIQUE

Conventionally, vehicle drive devices have been known which drive left and right wheels of the vehicle with only motors (electric motors). For example, one of the proposed vehicle drive devices connect motors one to each of the left and the right wheels so that the left and the right wheels can be driven independently from each other. Such a vehicle drive device can generate a rotational speed difference and a torque difference between the left and the right wheels by making the driving forces of the left and the right motors different from each other. This improves the turning performance of the vehicle and the stability of the vehicle body while turning (see Patent Document 1).

PRIOR ART REFERENCE

Patent Document

[Patent Document 1] Japanese Laid-open Patent Publication No. 2017-184523

SUMMARY OF INVENTION

Problems to be Solved by Invention

In the technique described in Patent Document 1, an inverter is installed on a partitioning wall that partitions an accommodating space of a reducer and an accommodating space of the inverter. With this structure, there is likely to be a surplus space above the inverter within the accommodating space of the inverter, which requires improvement for the compactness. In addition, an inverter includes various components such as a capacitor and a semiconductor module, some arrangements of which make it difficult to reduce the size of the inverter. For example, an arrangement that overlays the components of an inverter in the up-down direction tends to expand the height dimension of the inverter. Therefore, a demand has arisen for developing a vehicle drive device capable of compactly accommodating an inverter in a limited mounting space.

Components of an inverter generate heat while the inverter is operating. In particular, a capacitor and a semiconductor, which easily become heated to a high temperature, are cooled by water-cooling or air-cooling. Since insufficient cooling leads to degrading of the performance and deterioration of the components, high-cooling performance needs to be ensured.

With the foregoing problems in view, one of the objects of the present disclosure is to provide a vehicle drive device being capable of compactly mounting thereon an inverter and also having enhanced cooling performance. In addition to this object, actions and effects which are derived from each configuration of an embodiment to carry out the invention to be described below and which conventional technique does not attain are other objects of the present disclosure.

Means to Solve Problem

The vehicle drive device disclosed herein includes: a motor unit that includes a motor for driving mounted on a vehicle and a gear mechanism that transmits torque of the motor to each of left and right wheels of the vehicle; and an inverter that is arranged over the motor unit and that includes a capacitor smoothing electricity and a semiconductor module including a plurality of switching elements. The inverter includes a tray unit that accommodates the capacitor and the semiconductor module, and a cover that is in a flat-plate shape, is attached to the tray unit, and covers the capacitor and the semiconductor module from above the capacitor and the semiconductor module. The cover is integrated with a cooling unit through which a coolant for cooling the inverter flows, and the capacitor and the semiconductor module are attached to a lower surface of the cover.

Effects of Invention

According to the present disclosure, it is possible to provide a vehicle drive device capable of compactly mounting an inverter because space can be effectively used by a layout that suspends the capacitor and the semiconductor module on a cover. In addition, the components of the inverter can be cooled by a coolant flowing through a cooling unit integrated with a cover. In particular, since this cooling unit is apart from a motor unit which generates heat, the cooling unit is not heated by heat from the motor unit and also the air-cooling effect can be expected, therefore cooling performance can be enhanced.

EMBODIMENTS TO CARRY OUT INVENTION

Figure 7:
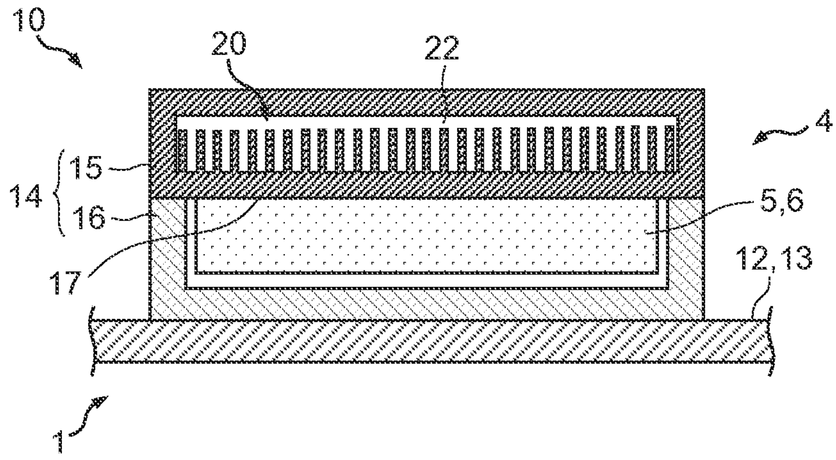
FIG. 7 is a diagram illustrating the structure of a vehicle drive device of the present disclosure.

Overview of Vehicle Drive Device:

FIG. 7 is a schematic diagram showing the structure of a vehicle drive device 10 of the present disclosure. The vehicle drive device 10 of the present disclosure includes a motor unit 1 that includes motors for driving and a gear mechanism that transmits the torque of the motor to each of the left and right wheels, an inverter 4 arranged over the motor unit 1, and a cooling unit 20 that compactly mounts thereon the inverter 4 and effectively cools a capacitor 5 and a semiconductor module 6, serving as components of the inverter 4.

As shown in FIG. 7, in the vehicle drive device 10, an inverter case 14 of the inverter 4 is disposed on the upper side of a casing (at least one of a motor housing 12 and a gearbox housing 13) that the motor unit 1 has. The inverter 4 includes the capacitor 5 that smooths electric power and the semiconductor module 6 including multiple switching elements. The inverter 4 includes a tray unit 16 that accommodates the capacitor 5 and the semiconductor module 6, and a cover 15 attached to the tray unit 16, thus the inverter case 14 is formed of the tray unit 16 and the cover 15.

The cover 15 is a member in a flat-plate shape that covers the capacitor 5 and the semiconductor module 6 from above, and is integrated with the cooling unit 20 through which a coolant for cooling the inverter 4 flows. Both the capacitor 5 and the semiconductor module 6 are attached to the lower surface 17 of the cover 15. That is, the capacitor 5 and the semiconductor module 6 are arranged to have "suspended layout" and are cooled by the cooling unit 20 provided over them.

The cooling unit 20 is spaced apart from the motor unit 1 and includes a first cooling path (not shown in FIG. 7) through which a coolant flows in one direction and a second cooling path 22 formed as a wider space than the first cooling path and provided right overhead the position where the semiconductor module 6 is attached. The coolant flows also through the second cooling path 22, and thereby effectively cools the semiconductor module 6, which is most easily heated. In order to enhance the cooling efficiency, a fin and/or a heat sink may be provided in the second cooling path 22, for example.

Hereinafter, the structure of the vehicle drive device 10 will now be detailed with reference to a specific embodiment. The following embodiment is exemplary and does not intend to exclude various changes and application of a technique not explicitly described in the present embodiment (and the modification).

EMBODIMENT

[1. Structure]

Figure 1:
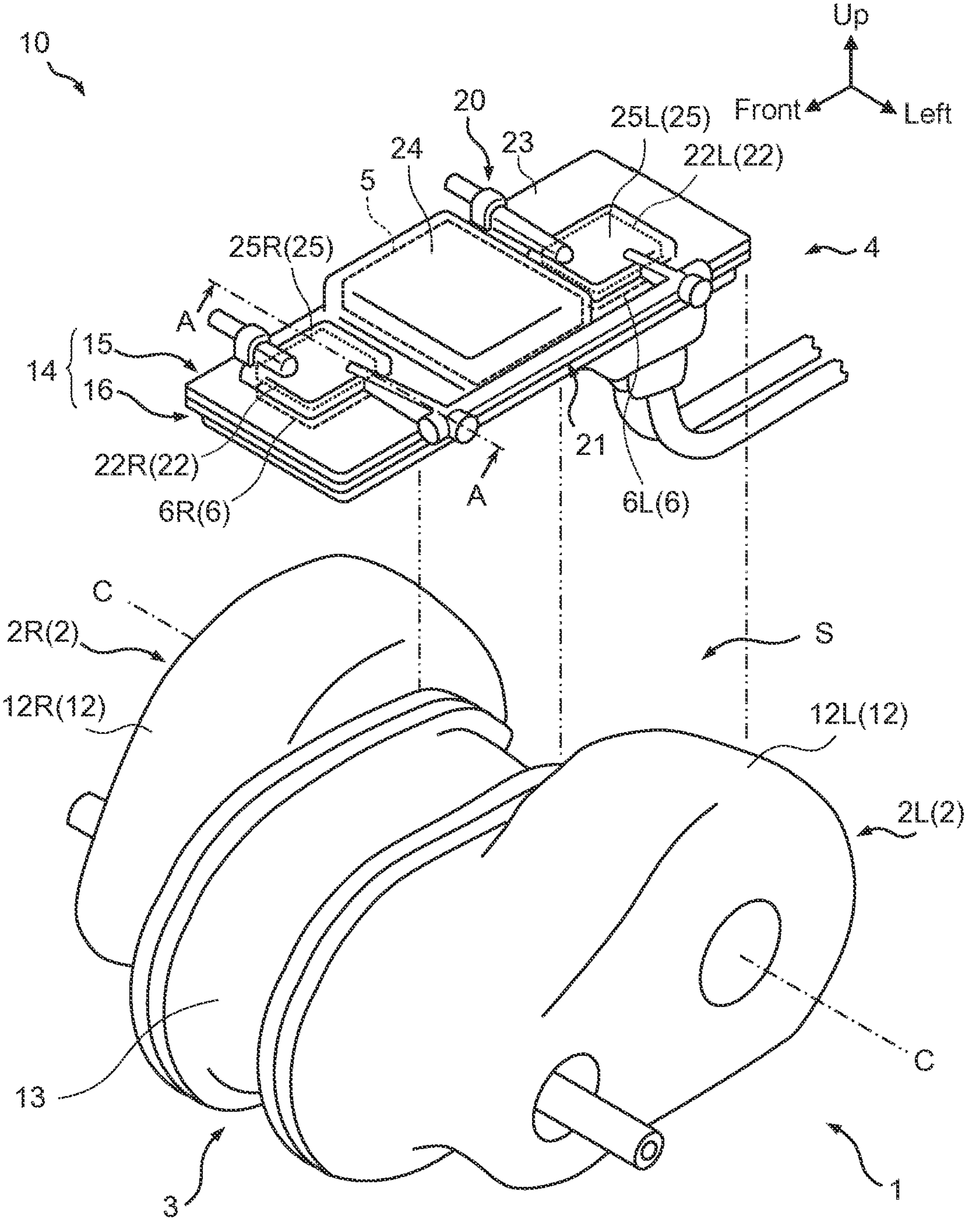
FIG. 1 is an exploded perspective diagram illustrating of a vehicle drive device according to an embodiment.

FIGS. 1-4 and FIG. 6 are diagrams illustrating the structure of a vehicle drive device 10 according to the present application example (embodiment). In the drawings, front-rear, left-right, and up-down represent directions determined with reference to the driver of the vehicle on which vehicle drive device 10 is mounted. As shown in FIG. 1, the vehicle drive device 10 is provided with a motor unit 1 including a driving motor 2 and a gearbox 3 mounted in the vehicle, and an inverter 4. The present embodiment illustrates a motor unit 1 including two motors 2 that receive power from a battery (not shown) mounted on the vehicle and drive left and right wheels of the vehicle.

The two motors 2 have rotating shafts C extending in the left-right direction (in width direction of the vehicle) (in the drawing, the rotational center of each rotating shaft indicated by a dashed-dotted line is denoted by a reference sign C), and are arranged coaxially and spaced apart from each other in the left-right direction. Hereinafter, the motor 2 arranged on the left side of the vehicle is referred to as a "left motor 2L" and the motor 2 arranged on the right side of the vehicle is referred to as a "right motor 2R'". The left motor 2L is connected to a power transmission path connected to at least the left wheel shaft. Similarly, the right motor 2R is connected to a power transmission path connected to at least the right wheel shaft. In an electric vehicle or a hybrid vehicle mounted thereon another driving motor or an internal combustion engine, the motors 2 function as a yaw moment generating source that generates turning force by increasing or decreasing at least driving force and braking force of left and right wheels. Further, in an electric vehicle not mounted thereon any other driving motor, the motors 2 also have a function as a driving source of the vehicle in addition to the above-described function.

Figure 2:
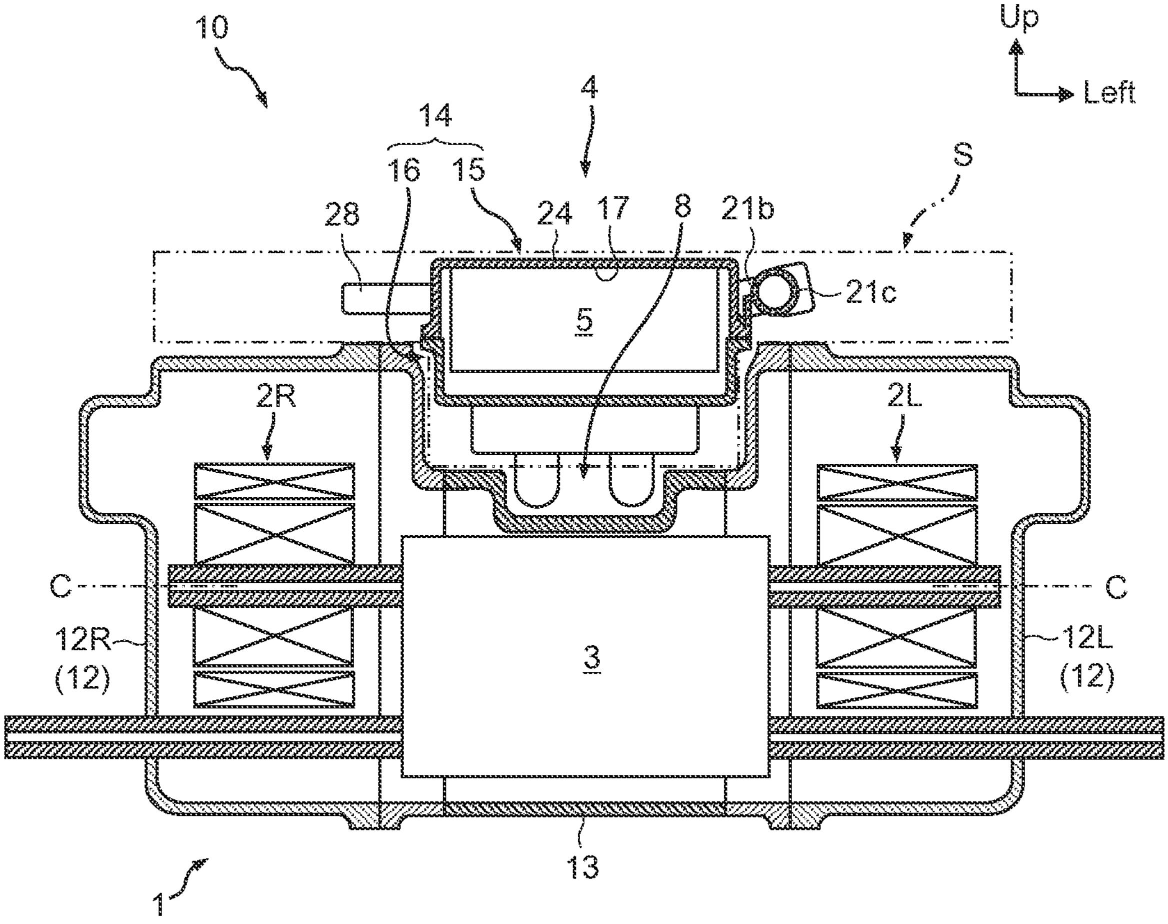
FIG. 2 is a sectional view illustrating an internal structure of the vehicle drive device of FIG. 1.

The two motors 2 of the present embodiment are configured the same as each other. Each motor 2 has a configuration incorporating therein motor elements such as a stator, a rotor, and a motor shaft. These elements are accommodated in left and right motor housings 12 (left motor housing 12L, right motor housing 12R) that form the exteriors (that incorporates electric motor elements of each of the motors 2 therein) of the respective motors 2, as shown in FIG. 2. The motor housings 12 are configured such that the bottoms of the respective bottomed cylindrical member face outward in the left-right direction and end bells are attached to apertures on the respective center sides in the left-right direction.

The stator is, for example, a stator which has a structure that winds a coil around a laminated iron core formed by depositing electromagnetic steel sheets each coated with an insulating coating and is fixed to the corresponding motor housing 12. The rotor is, for example, a cylindrical rotor in which a permanent magnet is inserted into a laminated iron core formed by depositing electromagnetic steel sheets each coated with an insulating coating and is loosely inserted into the inside of the stator concentrically with the central axis of the stator and fixed to an axial motor shaft. By changing the frequency of the AC power supplied to the stator, the rotational velocity of the magnetic field inside the stator is changed, and the angular velocity of the rotor and the motor shaft are changed. One end of the motor shaft is connected to the gearbox 3. The left motor 2L is arranged on the left side of gearbox 3 while the right motor 2R is arranged on the right side of the gearbox 3.

The gearbox 3 is a driving force transmission device sandwiched between the left motor housing 12L and the right motor housing 12R. The gearbox 3 includes a gearbox housing 13 that forms an exterior and a gear mechanism incorporated therein. The gear mechanism is a mechanism that amplifies the torques of the left motor 2L and the right motor 2R and transmits amplified torques to the left and the right wheels. In addition, the gear mechanism includes a mechanism (e.g., a differential gear mechanism, a planetary gear mechanism) for generating a torque difference between the left wheel shaft and the right wheel shaft.

The gearbox housing 13 of the present embodiment is offset downward from the left and the right motor housings 12L, 12R, Specifically, the positional relationship between the left and the right motor housings 12L, 12R and the gearbox housing 13 is set such that the gearbox 3 is displaced downward and forward (radial direction of the left and the right motors 2) on the basis of the rotating shafts C of the left and the right motors 2 when seen from the side. This layout causes gearbox 3 to form, in conjunction with the motor housings 12L, 12R, a depressed portion 8 that recesses downward. As shown in FIG. 2, the depressed portion 8 is in a basin shape depressed downward between the left and the right motor housings 12L, 12R.

The inverter 4 is a converter (DC-AC inverter) that mutually converts the power (DC power) of a DC circuit and the power (AC power) of the AC circuits on the side of the motors 2. This inverter 4 has a function of converting DC power into AC power and supplying the converted AC power to both the left and the right motors 2. The inverter 4 is arranged in a mounting space S (two-dot chain line in FIG. 2) over the left and the right motors 2 and the gearbox 3 (i.e., motor unit 1). This mounting space S is a space formed between the vehicle drive device 10 and the surrounding equipment or the vehicle body at a position where the vehicle drive device 10 is mounted, and is in a T-shape including the depressed portion 8 between the motor housings 12L, 12R and a space over the motor housings 12L, 12R when seen from the front side.

In the present embodiment, the tipper end of each motor housing 12 is located right overhead the rotating shafts C of the corresponding motor 2 (i.e., the part overlapping the rotating shafts C when seen from above). Therefore, the part (the space corresponding to the lateral bar of the T shape) above the motor housings 12 among the mounting space S is minimized at a portion right overhead the rotating shafts C. In other words, the mounting space S is secured more largely at a position deviated from the rotating shafts C than at a position overlapping the rotating shafts C when seen from above.

As shown in FIG. 1, the inverter 4 includes a capacitor 5 for smoothing electric power and semiconductor module 6 including multiple switching elements. The capacitor 5 and the semiconductor module 6 are incorporated in an inverter case 14 forming the exterior of the inverter 4. In addition to the capacitor 5 and the semiconductor module 6, the components of the inverter 4 includes, for example, a current sensor (not shown) that detects a current value of the inverter 4. Components except for the capacitor 5 and the semiconductor module 6 are also incorporated in the inverter case 14 along with the capacitor 5 and the semiconductor module 6.

The inverter case 14 is arranged in the mounting space S and is fixed to the left and the right motor housings 12L, 12R. In addition, the inverter case 14 is formed by a combining a tray unit (lower inverter case) 16 that accommodates the capacitor 5 and the semiconductor module 6, and a plate-shaped cover (upper inverter case) 15 that covers the capacitor 5 and the semiconductor module 6 from above. The tray unit 16 of the present embodiment is provided separately from the gearbox 3 (gearbox housing 13). Alternatively, the tray unit 16 may be provided integrally (as part of the gearbox housing 13) with the gearbox 3.

The capacitor 5 is an electronic component having a larger thickness (size in the up-down direction) than the remaining components (i.e., the semiconductor module 6 and the current sensor) of the inverter 4. In the present embodiment, one capacitor 5 is shared by both the left and the right motors 2L,2R. In a current controlled inverter, the capacitor 5 is disposed on an electricity supply line of AC power obtained by conversion in the semiconductor module 6, while in a voltage controlled inverter, the capacitor 5 is disposed on an input-side of DC power. The capacitor 5 functions as a kind of filter to stabilize the current supplied to the motors 2.

The semiconductor module 6 is a power module formed by forming a three-phase bridging circuit including multiple switching elements, diodes, and the like on a substrate (substrate for an electronic circuit). By intermittently switching the connecting states of the respective switching elements, the DC power is converted into three-phase AC power. Examples of the switching elements include semiconducting devices such as thyristors, IGBTs (Insulated Gate Bipolar Transistors), and power MOSFETs (Metal Oxide Semiconductor Field-Effect Transistors).

The semiconductor module 6 of the present embodiment includes (a pair of) left and right modules 6L,6R (left modules 6L, right module 6R) used one for each of the left and the right motors 2L,2R. The left and the right modules 6L,6R are provided separately from each other. The left module 6L is a dedicated semiconductor module to the left motor 2L. The AC power generated by the left module 6L is supplied to the left motor 2L. On the other hand, the right module 6R is a dedicated semiconductor module to the right motor 2R. The AC power generated by the right module 6R is supplied to the right motor 2R.

In relation to the arrangement of the inverter 4 of the present embodiment, the capacitor 5 having the largest thickness is arranged at the depressed portion 8 (in the depressed portion 8 or right overhead the depressed portion 8). Further, the semiconductor module 6 is arranged at a position inside or right overhead the depressed portion 8 and also different from both the capacitor 5 and the respective rotating shafts C when seen from above. Therefore, when seen from above, the capacitor 5 is located between the left and the right motor housings 12L, 12R, and the semiconductor module 6 is displaced in the front-rear direction or the left-right direction with respect to the capacitor 5 and the rotating shafts C and therefore does not overlap with the capacitor 5 and the rotating shafts C. Although in the present embodiment, the left module 6L is arranged on the rear side of the capacitor 5 while the right module 6R is arranged on the front side of the capacitor 5, alternatively, the arrangement of the left and right modules 6L,6R may be opposite.

The inverter case 14 is shaped according to the arrangement of the capacitor 5, the semiconductor module 6 and the like so as to be able to accommodate the components of the inverter 4. In this embodiment, since both the capacitor 5 and the semiconductor module 6 are disposed so as to overlap the depressed portion 8 in the up-down direction, which means that the capacitor 5 and the semiconductor module 6 are arranged in the depressed portion 8 or right overhead the depressed portion 8, the inverter case 14 has a shape corresponding to the shape of the depressed portion 8 when seen from above, that is, a substantially rectangular shape longer in the front-rear direction when seen from above.

Figure 3:
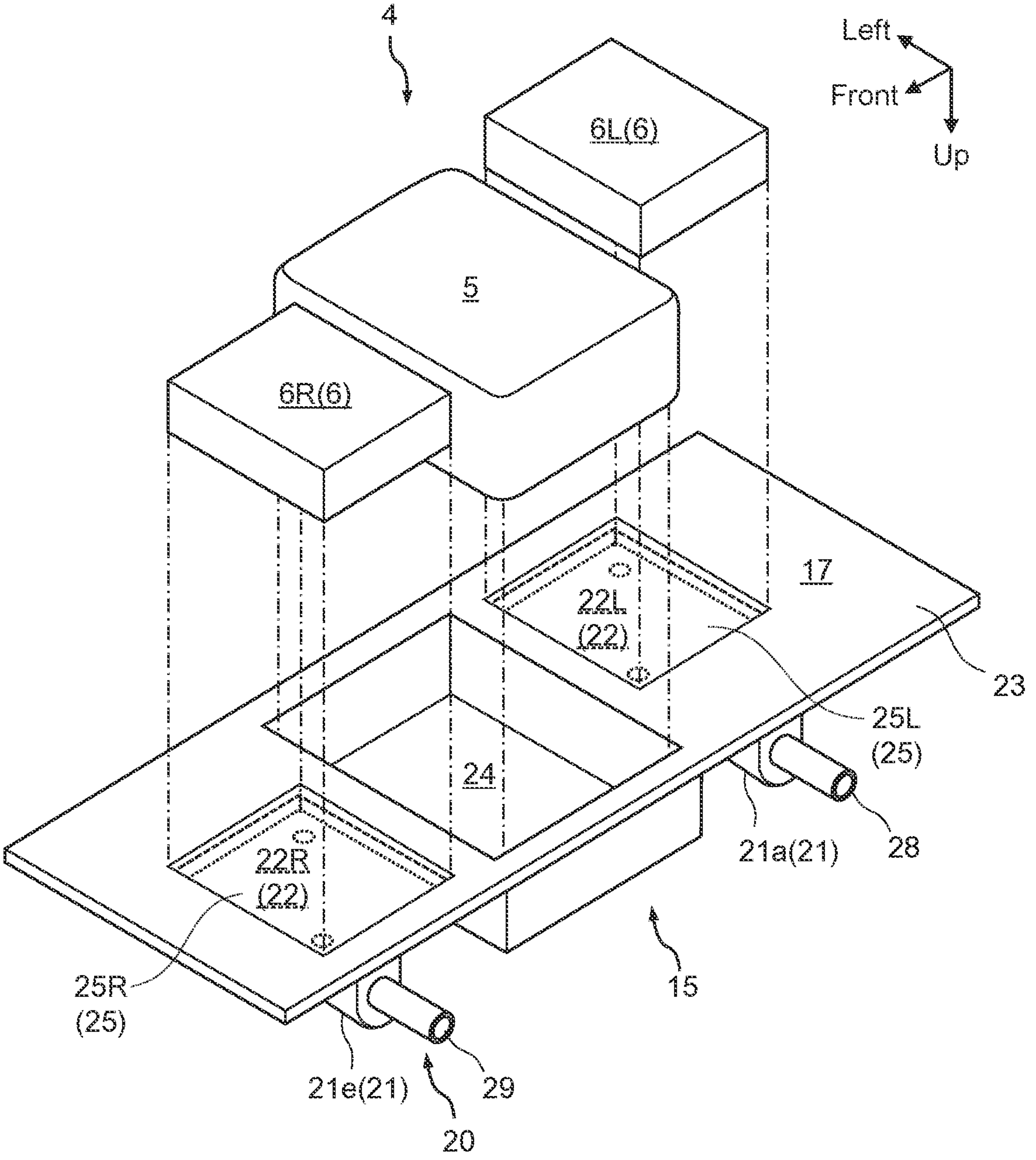
FIG. 3 is an exploded perspective view illustrating an internal structure of an inverter provided to the vehicle drive device of FIG. 1 and is an upside-down drawing.

As shown in FIGS. 2 and 3, the capacitor 5 and the semiconductor module 6, are both attached to the lower surface 17 (hereinafter, also referred to as "cover lower surface 17") of the cover 15. The cover lower surface 17 is an inner surface that faces the tray unit 16 (downward) in a state where the cover 15 is attached to the tray unit 16. The capacitor 5 and the semiconductor module 6 both attached to the cover lower surface 17 are accommodated in the tray unit 16, being suspended from the cover lower surface 17.

As shown in FIGS. 1 and 3, the cover 15 of the present embodiment includes a flat plate portion 23 in a flat-plate shape attached to the circumference of the tray unit 16, a bulging portion 24 formed in a shape bulging upward from the flat plate portion 23 and accommodating the capacitor 5, and a cooling unit 20 through which a coolant for cooling the semiconductor module 6 flows. The cooling unit 20 is arranged apart from the motors 2 and the gearbox 3, and includes a first cooling path 21 through which the coolant flows in one direction and a second cooling path 22 formed to be a wider space than the first cooling path 21. The structure of the cooling unit 20 will be described below.

The flat plate portion 23 is a portion which closes the aperture defined by the circumference edge of the tray unit 16 and at which the cooling unit 20 integrated with the cover 15 is provided. The bulging portion 24 is formed into a shape bulging upward at the center portion (center in the front-rear direction) of the cover 15 (flat plate portion 23). The capacitor 5 is fixed at position corresponding to the bulging portion 24 among the cover lower surface 17 so as to be suspended from the bulging portion 24. This means that the bulging portion 24 is bulged into a shape (in this example, a substantially rectangular parallelepiped) that can contain at least the capacitor 5.

The cover 15 of the present embodiment further includes two raised portions 25 (left raised portion 25L, right raised portion 25E) each bulging upward on one of the sides of the front-rear direction of the bulging portion 24. Each of the raised portion 25 has a bulging shape having a smaller size in the up-down direction (i.e., a smaller bulging amount from the flat plate portion 23) than that of bulging portion 24, and has a bottom surface flush with the flat plate portion 23. This means that each raised portion 25 is hollow and has a space serving as the second cooling path 22 inside. The left and the right modules 6L,6R are disposed right under the raised portions 25L,25R, respectively. The left and the right module 6L,6R are fixed at positions corresponding to the raised portions 25L,25R among the cover lower surface 17, respectively, so as to be suspended from the flat plate portion 23.

As shown in FIGS. 1, 3, 4, and 6, the second cooling path 22 is integrated with the cover 15, and is provided in two raised portions 25L,25R bulging upward from the flat plate portion 23. The second cooling path 22 includes a left second cooling path 22L and a right second cooling path 22R that cool the left and right modules 6L,6R, respectively. The left second cooling path 22L and the right second cooling path 22R are provided right overhead the positions where the left module 6L and the right module 6R are attached, respectively, and the coolant flowing through the left second cooling path 22L and the right second cooling path 22R actively cools the semiconductor module 6. The second cooling path 22 is preferably provided with, for example, a fin or a heat sink to enhance the cooling-efficiency.

Figure 4:
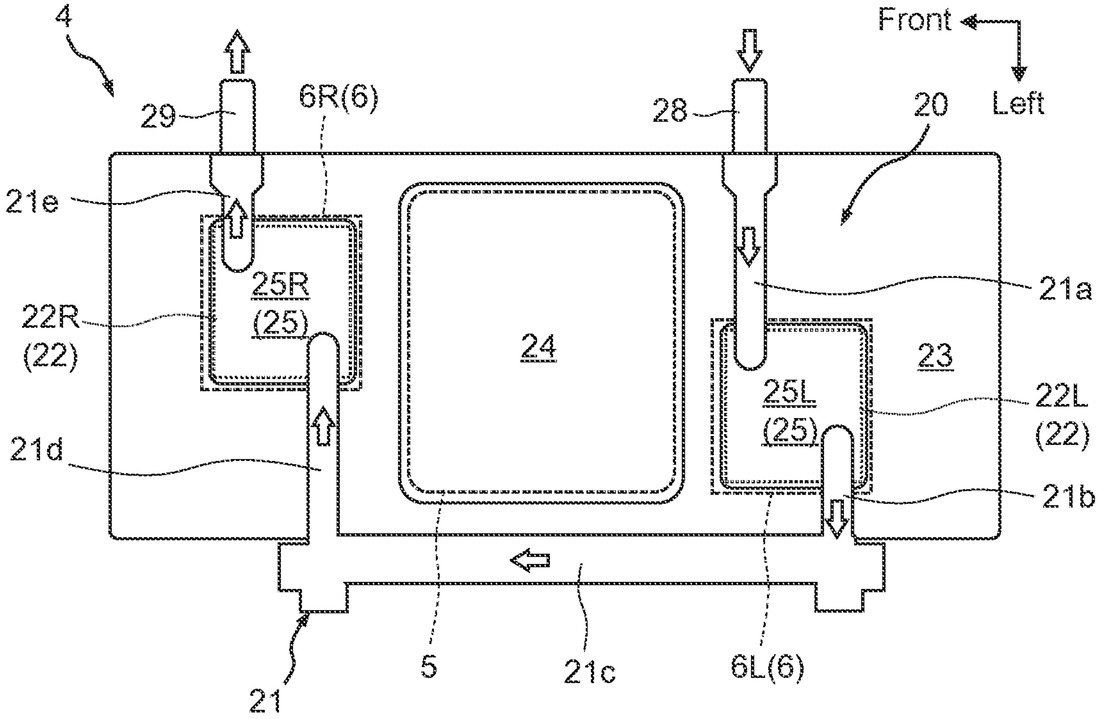
FIG. 4 is a top view illustrating a cooling unit of the inverter of FIG. 3.

As shown in FIGS. 1, 3, and 4, the first cooling path 21 is also integrated with the cover 15 and has a tubular shape bulging upward from the flat plate portion 23. Inside the first cooling path 21, a space (hollow portion) through which the coolant flows is provided. The first cooling path 21 of the present embodiment includes a rear supply path 21*a* and a rear discharge path 21*b* that are connected to a left second cooling path 22L in the rear raised portion 25L, a front supply path 21*d* and a front discharge path 21*e* that are connected to a right second cooling path 22R in the front raised portion 25R, and a connecting path 21*c* connecting the rear discharge path 21*b* and the front supply path 21*d* to each other.

The two supply paths 21*a*,21*d* and the two discharge paths 21*b*,21*e* all extend along the left-right direction. The rear supply path 21*a* extends rightward from the rear raised portion 25L while the rear discharge path 21*b* extends leftward from the rear raised portion 25L. On the other hand, the front supply path 21*d* extends leftward from the front raised portion 25R, while the front discharge path 21*e* extends rightward from the front raised portion 25R. The connecting path 21*c* is disposed on the left side of the bulging portion 24 and extends along the front-rear direction. As described above, the first cooling path 21 consisting of the five flow paths 21*a* to 21*e* connects the two second cooling paths 22L,22R in series and is formed so as to enclose the circumference of the capacitor 5 disposed in the bulging portion 24 from three directions, thus the coolant flowing through the first cooling path 21 cools the capacitor 5.

The cooling unit 20 is formed on the flat plate portion 23 so as to overlap the bulging portion 24 when seen from a direction perpendicular to the up-down direction. In other words, the position in the up-down direction of the cooling unit 20 is set to match (or be included in) the position in the up-down direction of the bulging portion 24. In this embodiment, the cooling unit 20 is formed such that the two supply paths 21*a*,21*d* and the two discharge paths 21*b*,21*e* overlap the bulging portion 24 respectively when seen from the front-rear direction, and the connecting path 21*c* overlaps the bulging portion 24 when seen from the left-right direction. The rear supply path 21*a* and the front discharge path 21*e* are connected to pipes 28,29, respectively.

The first cooling path 21 is supplied with a coolant from the pipe 28 as indicated by a white arrow in FIG. 4. The coolant is supplied to the left second cooling path 22L through the rear supply path 21*a*, cools the left module 6L through, for example, a heat sink, and then is discharged to the rear discharge path 21*b*. Then the coolant is supplied to the front supply path 21*d* through the connecting path 21*c*, is supplied from the front supply path 21*d* to the right second cooling path 22R, cools the right module 6R likewise through a non-illustrated heat sink, and then is discharged to the front discharge path 21*e*. The coolant discharged to the front discharge path 21*e* is discharged from the pipe 29 to the outside of the inverter 4.

Figure 6:
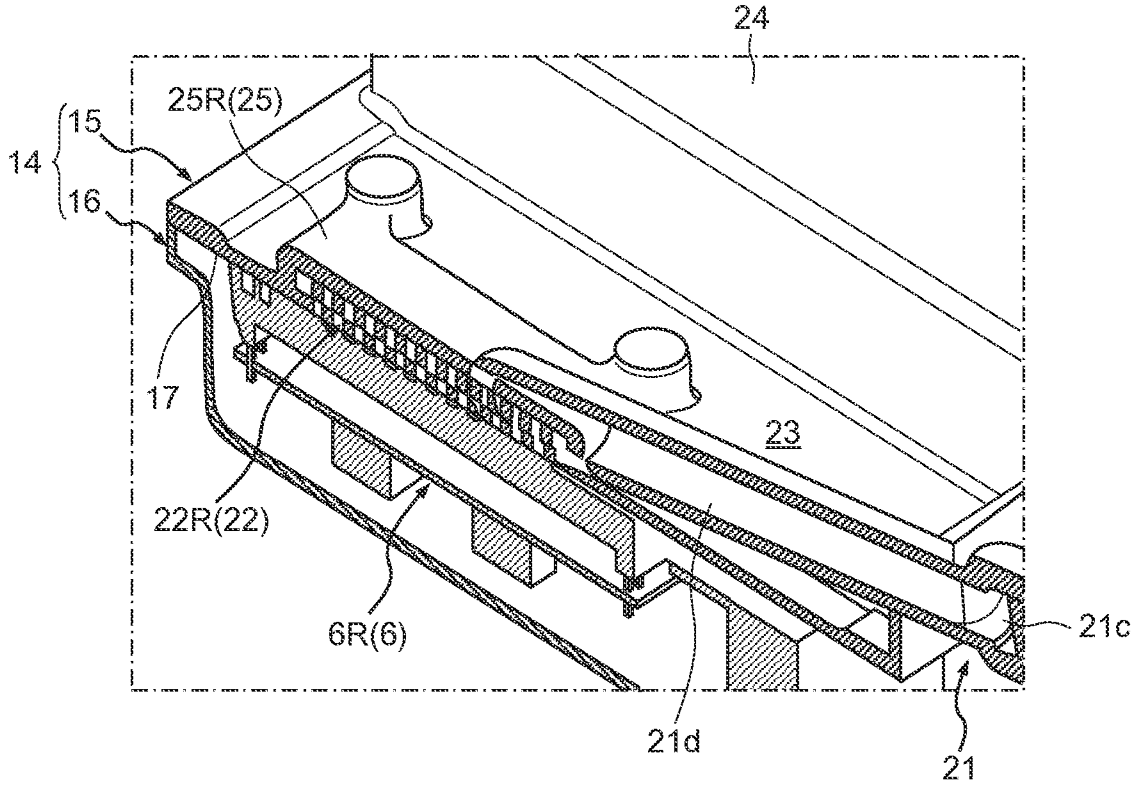
FIG. 6 is an enlarged view of a cross section cut along by Arrows A-A of FIG. 1.

In addition, the first cooling path 21 of the present embodiment has a portion extending in the left-right direction and being inclined upward to the outside of the left-right direction in the mounting space S. Specifically, as shown in FIGS. 2 and 6, the rear discharge path 21*b* and the front supply path 21*d* extending leftward from the raised portion 25 are linearly upwardly inclined so as to rise higher as distant further from the raised portion 25. With this structure, as shown in FIG. 2, since interference of the first cooling path 21 with the surrounding objects (for example, the motor housings 12) can be avoided in the mounting space S having a T-shape when viewed from the front, the inverter 4 can be arranged more compactly.

To complement this, a compacter arrangement of the inverter 4 can be accomplished by arranging the inverter 4 further closer to the gearbox housing 13 and in the depressed portion 8 as much as possible. However, if the cover 15 is formed to have a minimum size that can suspend the capacitor 5 and other components, the connecting path 21*c* among the first cooling path 21 integrated with the cover 15 projects outward from the outer circumference of the cover 15. Therefore, if the rear discharge path 21*b* and the front supply path 21*d* connected to the connecting path 21*c* are not inclined upward, the first cooling path 21 has a high possibility of interfering with the surrounding objects (for example, the motor housings 12). Alternatively, to avoid this interference, the inverter 4 must be positioned above depressed portion 8. Therefore, as described above, if the portions (in the present embodiment, the rear discharge path 21*b* and the front supply path 21*d*) extending in the left-right direction are inclined upward, such problems are solved.

Figure 5:
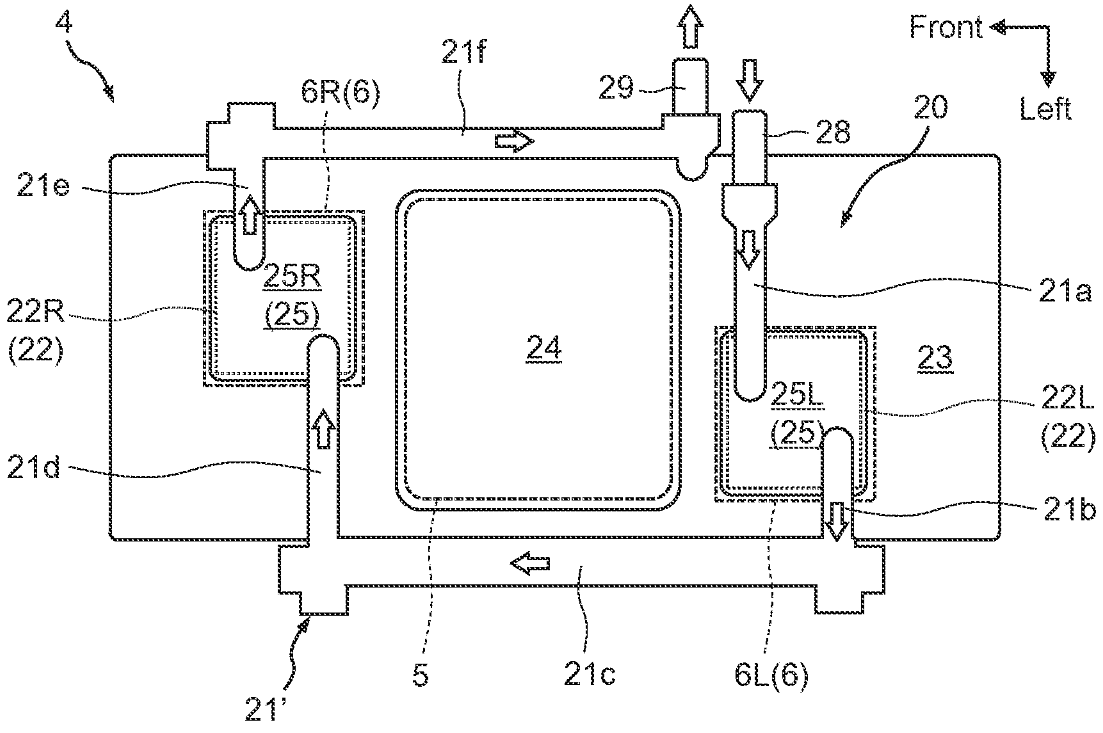
FIG. 5 is a top view illustrating a modification of the cooling unit of the inverter.

The structure of the cooling unit 20 is not limited to that shown in FIG. 4. For example, as shown in FIG. 5, a first cooling path 21' may be formed so as to connect two second cooling paths 22L,22R to each other in series and is formed to enclose the circumference of the capacitor 5 from four sides. The first cooling path 21' further includes an extending path 21*f* extending rearward from the front discharge path 21*e* and being disposed on the right side of the capacitor 5 in addition to the rear supply path 21*a*, the rear discharge path 21*b*, the connecting path 21*c*, the front supply path 21*d*, and the front discharge path 21*e* constituting the first cooling path 21 of FIG. 4.

The pipe 29 is connected to the rear end of the extending path 21*f*, and the coolant passed through the first cooling path 21' is discharged from the rear end of the extending path 21*f* to the outside of the inverter 4. Such a structure that encloses the circumference of the capacitor 5 from the four sides can eliminate a portion that cannot be cooled in the circumference of the capacitor 5. Here, in this structure, the front discharge path 21*e* extending in the left-right direction and being connected to the extending path 21*f* is preferably inclined upward to the outside of the left-right direction (as distant further from the raised portion 25R).

[2. Actions and Effects]

(1) As shown in FIGS. 1-3 and 7, in the vehicle drive device 10 described above, both the capacitor 5 and the semiconductor module 6, serving as the components of the inverter 4, are arranged in the "suspended layouts" which means that the capacitor 5 and the semiconductor module 6 are suspended from the cover lower surface 17. This layout makes it possible to efficiently use the space in the inverter case 14, and furthermore, as compared with a structure that attaches the capacitor 5 and the semiconductor module 6 to a base plate which is separated from the cover 15, such a base plate can be omitted. In other words, since the cover 15 is provided with also the function of the base plate, the number of components can be reduced and the size in the up-down direction of the inverter 4 can be reduced so that the space can be further saved. Accordingly, the vehicle drive device 10 can compactly mount the inverter 4 in the limited mounting space S and achieve the size reduction of the vehicle drive device 10.

In addition, the components of inverter 4 including the capacitor 5 and the semiconductor module 6 can be cooled by the coolant flowing through the cooling unit 20 integrated with the cover 15. In particular, since this cooling unit 20 is distant from a motor unit 1 which generates heat, the cooling unit is not heated by heat from the motor unit 1, the temperature of the coolant can be kept low, and the cooling efficiency can be enhanced. In addition, because of the presence of the air flow on the top surface (outer surface) of the cover 15, the cooling unit 20 can be air-cooled, which also can enhance the cooling efficiency. In addition, in the space surrounded by the tray unit 16 and the cover 15 (i.e., inside inverter case 14), although the high-temperature air stays in the upper portion, since the cooling unit 20 is located above, the atmospheric temperature in the case can also be lowered. Therefore, the vehicle drive device 10 can ensure the high-cooling performance.

(2) As shown in FIGS. 1 and 3, the cover 15 described above is provided with the bulging portion 24 that is formed in a shape bulging upward from the flat plate portion 23 and that accommodates the capacitor 5. As described above, by locally projecting the bulging portion 24 that accommodates the capacitor having a large thickness from the flat plate portion 23, the accommodability of the capacitor 5 can be ensured, avoiding increase in the overall size of the cover 15. Furthermore, the capacitor 5 can be air-cooled via the bulging portion 24.

(3) Since the cooling unit 20 described above is provided with the second cooling path 22 right overhead a position where the semiconductor module 6 is attached, the semiconductor module 6 can be efficiently cooled by the coolant flowing through the second cooling path 22.

(4) Furthermore, in the above-described vehicle drive device 10, the capacitor 5 can be cooled by the coolant flowing through the first cooling path 21 enclosing the circumference of the capacitor 5 from the three or four directions while the respective modules 6L,6R are cooled by the coolant flowing through the second cooling path 22, the cooling efficiency of the inverter 4 can be enhanced. In addition, by integrating the serial first cooling path 21 with the cover 15, a hose separated from the inverter 4 can be eliminated, which means that the number of components can be reduced. Furthermore, since the omission of a hose eliminates the requirement for considering bending or swinging of the hose, the degree of freedom in layout is increased, which further allows to achieve a compact layout.

(5) In the vehicle drive device 10 described above, since the inverter 4 is disposed in the mounting space S and the capacitor 5 having the largest thickness among the components of the inverter 4 is disposed on the depressed portion 8, a further compact arrangement can be achieved. Furthermore, since a portion extending in the left-right direction of the first cooling path 21 is inclined, the inverter 4 can be compactly mounted without interfering with the surrounding objects of the depressed portion 8.

In this embodiment, both the left and right modules 6L,6R are disposed in the depressed portion 8 and are disposed one on each of the sides in the front-rear direction with respect to the capacitor 5. As described above, by arranging both the capacitor 5 and the left and right modules 6L,6R serving as the components of the inverter 4 in the depressed portion 8, the size in the up-down direction of the vehicle drive device 10 can be made further compact. Further, by sandwiching the capacitor 5 between the left and right modules 6L,6R, the units (e.g., assemblies including the motor housings 12 and the semiconductor module 6 and the like, and the wires from the motors 2) for the left and right motors 2L,2R can be shared by the motors. This contributes to simplifying and cost reduction of the assembly operation of the vehicle drive device 10.

In the present embodiment, as shown in FIGS. 1 and 4, the cooling unit 20 is formed on the flat plate portion 23 of the cover 15 so as to overlap the bulging portion 24 when seen from a direction perpendicular to the up-down direction. As described above, by arranging the cooling unit 20 at the same height position as the bulging portion 24 in the up-down direction, it is possible to effectively utilize a dead space adjoining to the bulging portion 24 in a direction perpendicular to the up-down direction. Therefore, the cooling performance of the semiconductor module 6 can be ensured while making the size in the up-down direction of the vehicle drive device 10 more compact.

[3. Miscellaneous]

The configurations of the present embodiment and the modifications can be variously modified without departing from the scope thereof. Further, the configurations of the present embodiment and the modifications can be selected or omitted as needed, or can be combined as appropriate.

For example, in the above-described first cooling path 21,21', the rear discharge path 21*b* and the front supply path 21*d* are connected in series by the connecting path 21*c*, in an alternative of which, the rear supply path 21*a* and the rear discharge path 21*b* connected to the second cooling path 22L may be connected in parallel to the front supply path 21*d* and the front discharge path 21*e* connected to the right second cooling path 22R. This means that more than two first cooling paths through which the coolant flows in one direction may be provided, thus, for example, a cooling unit having two first cooling paths parallel to each other may be integrated with the cover.

For example, the above embodiment illustrates the vehicle drive device 10 that arranges the gearbox 3 offset downward and forward on the basis of the rotating shafts C of the motors 2 when seen from the side, in an alternative of which the gearbox 3 may be offset downward and rearward. At least by offsetting the gearbox housing 13 downward with respect to the left and right motor housings 12L,12R, arrangement of the inverter case 14 using the depressed portion 8 can be easily accomplished and the inverter 4 can be easily compactly arranged in the mounting space S. This alternative can achieve the same actions and effects as those of the above embodiment.

The left and right modules 6L,6R may be integrated. Specifically, like the capacitor 5, a single semiconductor module 6 may be provided and shared by the left and right motors 2. In this alternative, only one second cooling path 22 is sufficiently arranged right overhead one semiconductor module 6.

The shape of the above cover 15 is exemplary. The cover 15 may be in any shape as long as a cooling unit is integrated therewith, and, may be formed into a flat-plate shape not having the bulging portion 24 or the raised portion 25.

DESCRIPTION OF REFERENCE SIGN

1: Motor unit
2: Motor
3: Gearbox
4: Inverter
5: Capacitor
6: Semiconductor module
8: Depressed portion
10: Vehicle drive device
12: Motor housing
13: Gearbox housing
14: Inverter case
15: Cover
16: Tray unit
17: Cover lower surface
20: Cooling unit
21: First cooling path
21*a*: Rear supply path
21*b*: Rear discharge path (portion extending in left-right direction)
21*c*: Connecting path
21*d*: Front supply path (portion extending in left-right direction)
21*e*: Rear discharge path
21*f*: Extending path
22: Second cooling path
22L: Left second cooling path
22R: Right second cooling path
23: Flat plate portion
24: Bulging portion
25: Raised portion
28,29: Pipe
C: Rotating shaft
S: Mounting space

The invention claimed is:

1. A vehicle drive device comprising:
a motor unit that comprises a motor for driving mounted on a vehicle and a gear mechanism that transmits torque of the motor to each of left and right wheels of the vehicle; and
an inverter that is arranged over the motor unit and that comprises a capacitor smoothing electricity and a semiconductor module including a plurality of switching elements, wherein
the inverter includes a tray unit that accommodates the capacitor and the semiconductor module, and a cover that is in a flat-plate shape, is attached to the tray unit, and covers the capacitor and the semiconductor module from above the capacitor and the semiconductor module,
the cover is integrated with a cooling unit through which a coolant for cooling the inverter flows,
the capacitor and the semiconductor module are attached to a lower surface of the cover, and
the cooling unit comprises a first cooling path through which the coolant flows in one direction, and a second cooling path being formed into wider space than the first cooling path and being provided right overhead a position where the semiconductor module is attached, the coolant flowing through the second cooling path.

2. The vehicle drive device according to claim 1, wherein
the cover includes a flat-plate portion attached to a circumference of the tray unit and provided with the cooling unit, and a bulging portion bulging upward from the flat-pate portion and accommodating the capacitor therein.

3. The vehicle drive device according to claim 2, wherein
the motor unit comprises two of the motors serving as left and right motors that include respective rotating shafts extending in a left-right direction of the vehicle, being spaced apart in the left-right direction from each other, and driving the left and right wheels,
the gear mechanism amplifies torque of the left and right motors and transmits the amplified torque to each of the left and right wheels,
the semiconductor module comprises two modules used for the left and right motors, respectively,
two of the second cooling paths are provided right overhead respective positions at which the two modules are attached, and
the first cooling path connects the two second cooling paths to each other in series, and is provided so as to enclose a circumference of the capacitor from three or four directions.

4. The vehicle drive device according to claim 3, wherein
the motor unit comprises a gearbox that is sandwiched between the left and right motors, and that forms, in conjunction with respective motor housings of the left and right motors, a depressed portion depressed downward,
the inverter is arranged in a mounting space including the depressed portion and being in a T-shape in a front view over the left and right motors and the gearbox, at least the capacitor being positioned in the depressed portion, and
the first cooling path has a portion extending in the left-right direction of the vehicle, the portion in the mounting space being upward inclined to an outside in the left-right direction.

5. The vehicle drive device according to claim 1, wherein
the motor unit comprises two of the motors serving as left and right motors that include respective rotating shafts extending in a left-right direction of the vehicle, being spaced apart in the left-right direction from each other, and driving the left and right wheels,
the gear mechanism amplifies torque of the left and right motors and transmits the amplified torque to each of the left and right wheels,
the semiconductor module comprises two modules used for the left and right motors, respectively,
two of the second cooling paths are provided right overhead respective positions at which the two modules are attached, and
the first cooling path connects the two second cooling paths to each other in series, and is provided so as to enclose a circumference of the capacitor from three or four directions.

6. The vehicle drive device according to claim 5, wherein
the motor unit comprises a gearbox that is sandwiched between the left and right motors, and that forms, in conjunction with respective motor housings of the left and right motors, a depressed portion depressed downward, the inverter is arranged in a mounting space including the depressed portion and being in a T-shape in a front view over the left and right motors and the gearbox, at least the capacitor being positioned in the depressed portion, and the first cooling path has a portion extending in the left-right direction of the vehicle, the portion in the mounting space being upward inclined to an outside in the left-right direction.

* * * * *